United States Patent [19]
Watanabe et al.

[11] Patent Number: 5,798,570
[45] Date of Patent: Aug. 25, 1998

[54] PLASTIC MOLDED SEMICONDUCTOR PACKAGE WITH THERMAL DISSIPATION MEANS

[75] Inventors: Norinaga Watanabe; Shinichi Nishi, both of Yokohama, Japan

[73] Assignee: Kabushiki Kaisha Gotoh Seisakusho, Yokohama, Japan

[21] Appl. No.: 749,215

[22] Filed: Nov. 14, 1996

[30]  Foreign Application Priority Data

Jun. 28, 1996  [JP]  Japan .................................. 8-188283

[51] Int. Cl.⁶ .......................... H01L 23/48; H01L 29/44
[52] U.S. Cl. .................... 257/796; 257/712; 257/713; 257/718; 257/705; 361/704; 361/707; 361/709
[58] Field of Search ............................ 257/712, 713, 257/796, 705, 666, 675, 670, 676, 718; 361/697, 704, 707, 709, 715, 718

[56]  References Cited

U.S. PATENT DOCUMENTS 5,442,234  8/1995  Liang ..................................... 257/675
5,455,462  10/1995  Marrs ..................................... 257/796
5,486,720  1/1996  Kierse ..................................... 257/796
5,594,282  1/1997  Otsuki ..................................... 257/796

FOREIGN PATENT DOCUMENTS 6-5746  1/1994  Japan .

*Primary Examiner*—Carl W. Whitehead, Jr.
*Attorney, Agent, or Firm*—Jacobson, Price, Holman & Stern, PLLC

[57]  ABSTRACT

In construction of a plastic molded semiconductor package incorporating a metallic heat sink, the heat sink is made of a thin plate but provided with a central die support depressed from the plane of a surrounding lead support, the section opposite the die support being exposed outside a plastic package. Use of a thin plate as the material enables efficient, continuous processing in production. Presence of the depressed die support assures elongated boundary between the heat sink and the plastic package, thereby effectively reducing undesirable invasion of outer contaminant.

9 Claims, 6 Drawing Sheets

1

PLASTIC MOLDED SEMICONDUCTOR PACKAGE WITH THERMAL DISSIPATION MEANS

BACKGROUND OF THE INVENTION

The present invention relates to a plastic molded semiconductor package and a method for producing the same, and more particularly relates to improvements in property and production of a plastic molded semiconductor package incorporating metallic heat sink partly exposed outside an encapsulating plastic package.

In construction of a semiconductor package including a semiconductor die encapsulated in a plastic package, a metallic heat sink is incorporated into the plastic package for effective dissipation of heat. One typical example of such a semiconductor package is disclosed in Japanese Patent Opening Hei. 6-5746, in which a part of the surface of a metallic heat sink is exposed outside a plastic package. The heat sink is provided with opposite, parallel first and second surfaces. A semiconductor die is arranged on the first surface at a position sufficiently remote from the outer surface of a plastic package and the second surface is exposed outside the plastic package. As a result, a relatively large distance exists between the first and second surfaces of the heat sink. Stated otherwise, the heat sink has a relatively thick construction.

Such a heat sink is generally produced via application of die-cutting to a flat metallic plate. In order to produce a thick heat sink, it is necessary to use a thick metallic plate which is unsuited for precise die-cutting. In addition, such a thick metallic plate is unsuited for rolling process. For these reasons, it is difficult to produce the conventional heat sink via continuous process.

When a heat sink is produced from a thin metallic plate, no long distance can be reserved between the exposed section of the heat sink and a semiconductor die. A short distance between the two tends to induce easy access of contaminant from outside a plastic package to the semiconductor die along a boundary between the plastic package and the heat sink. When the heat sink is made of a thin metallic plate, it is difficult in practice to arrange a seal ring circumferentially along the heat sink.

Thus, use of a thick metallic plate causes problems in production whereas use of a thin metallic plate causes problems in resistance against contamination.

SUMMARY OF THE INVENTION

It is the basic object of the present invention to reduce internal contamination of a plastic molded semiconductor package incorporating a metallic heat sink.

It is another object of the present invention to enable production of a heat sink from a thin metallic plate with reduced production cost.

In accordance with one basic aspect of the present invention, a plastic molded semiconductor package includes a metallic heat sink, a semiconductor die arranged on the heat sink, a plurality of electrically conductive leads attached to the heat sink, bond wires connecting the leads to the semiconductor die, and a plastic package encapsulating the above-described element with partial exposure of the heat sink. The heat sink is provided with a depressed central die support, a circumferential lead support surrounding the die support, a projecting central section opposite to the die support, and a circumferential section opposite to the lead support. The semiconductor die is provided on its first surface with juxtaposed contact pads and bonded at its second surface to the die support on the heat sink. The leads are attached at their inner ends to the lead support on the heat sink via an electrically insulative layer. Each bond wire connects the inner end of one lead to a corresponding contact pad on the semiconductor die.

In accordance with the production method of the present invention, a leadframe including juxtaposed leads is first prepared, a metallic heat sink including a depressed central die support and a circumferential lead support is next prepared, the leads are united to the heat sink via an insulative layer, a semiconductor die is bonded to the die support on the heat sink, the leads are connected via bond wires to contact pads on the semiconductor die, and the above-described elements are encapsulated by a plastic package with partial exposure of the heat sink.

DESCRIPTION OF THE PREFERRED EMBODIMENTS

Figure 1:
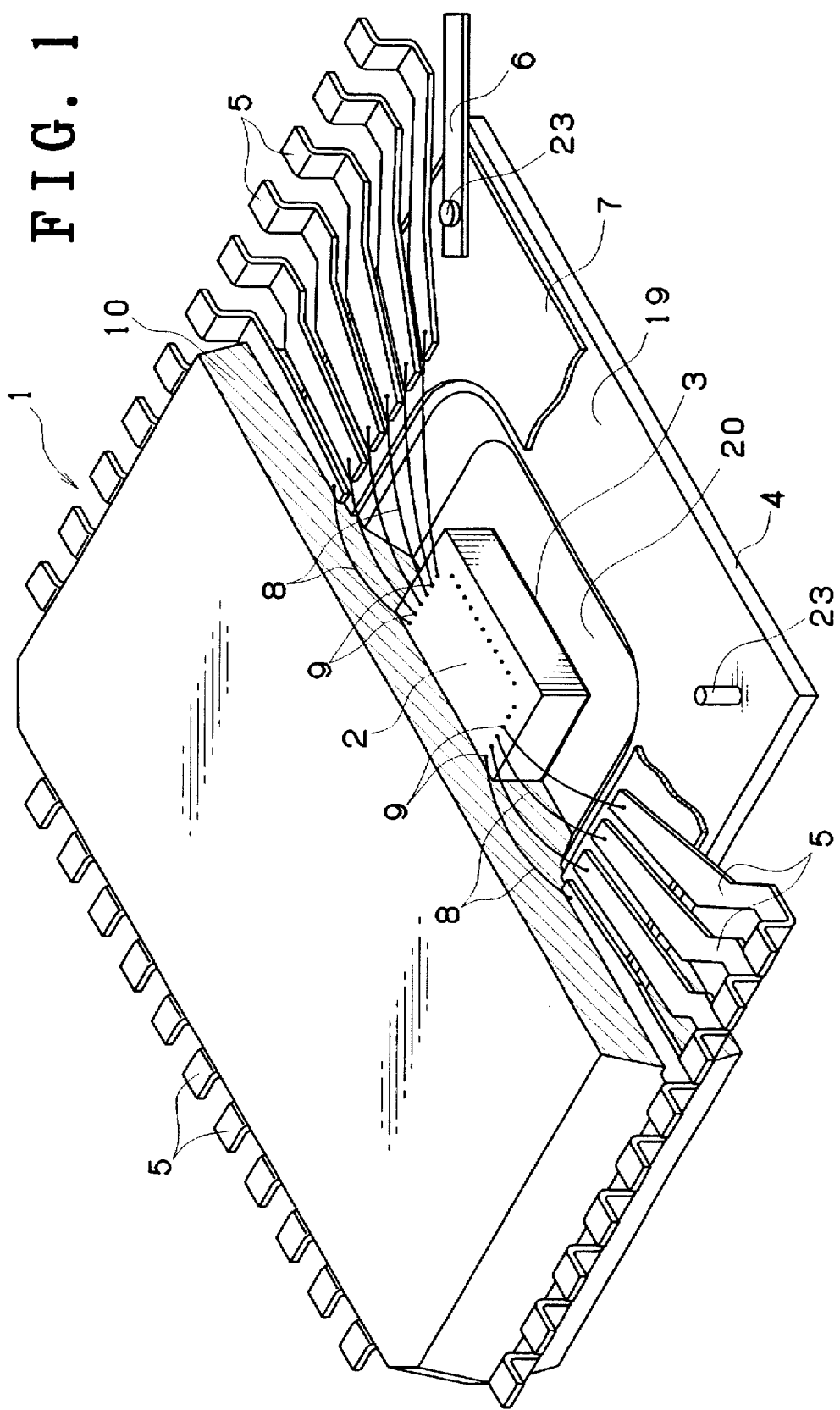
FIG. 1 is a perspective view, partly cut off, of one embodiment of the semiconductor package in accordance with the present invention.

One embodiment of the semiconductor package in accordance with the present invention is shown in FIG. 1, in which a semiconductor die 2 is bonded onto a heat sink 4 via a thermally conductive adhesive 3. A plurality of leads 5 and support bars 6 are juxtaposed along the circumference of the heat sink 4. In the case of the illustrated embodiment, the leads 5 are arranged on four sides of a square heat sink 4, the leads 5 may be arranged on three or fewer sides of the heat sink 4. The leads 5 and the support bars 6 are attached at their inner ends to the heat sink 4 via an electrically insulative sheet 7. In the case of the illustrated arrangement, four support bars 6 are arranged at four corners of the square heat sink 4. The inner ends of the leads 5 are connected to corresponding contact pads 9 on the semiconductor die 2 via bond wires 8. A plastic package 10 is provided to encapsulate the heat sink 4, the semiconductor die 2, the bond wires 8, the inner ends of the leads 5 and the support bars 6. The section of the heat sink 4 opposite to the semiconductor die 2 is exposed outside the plastic package 10.

Figure 2:
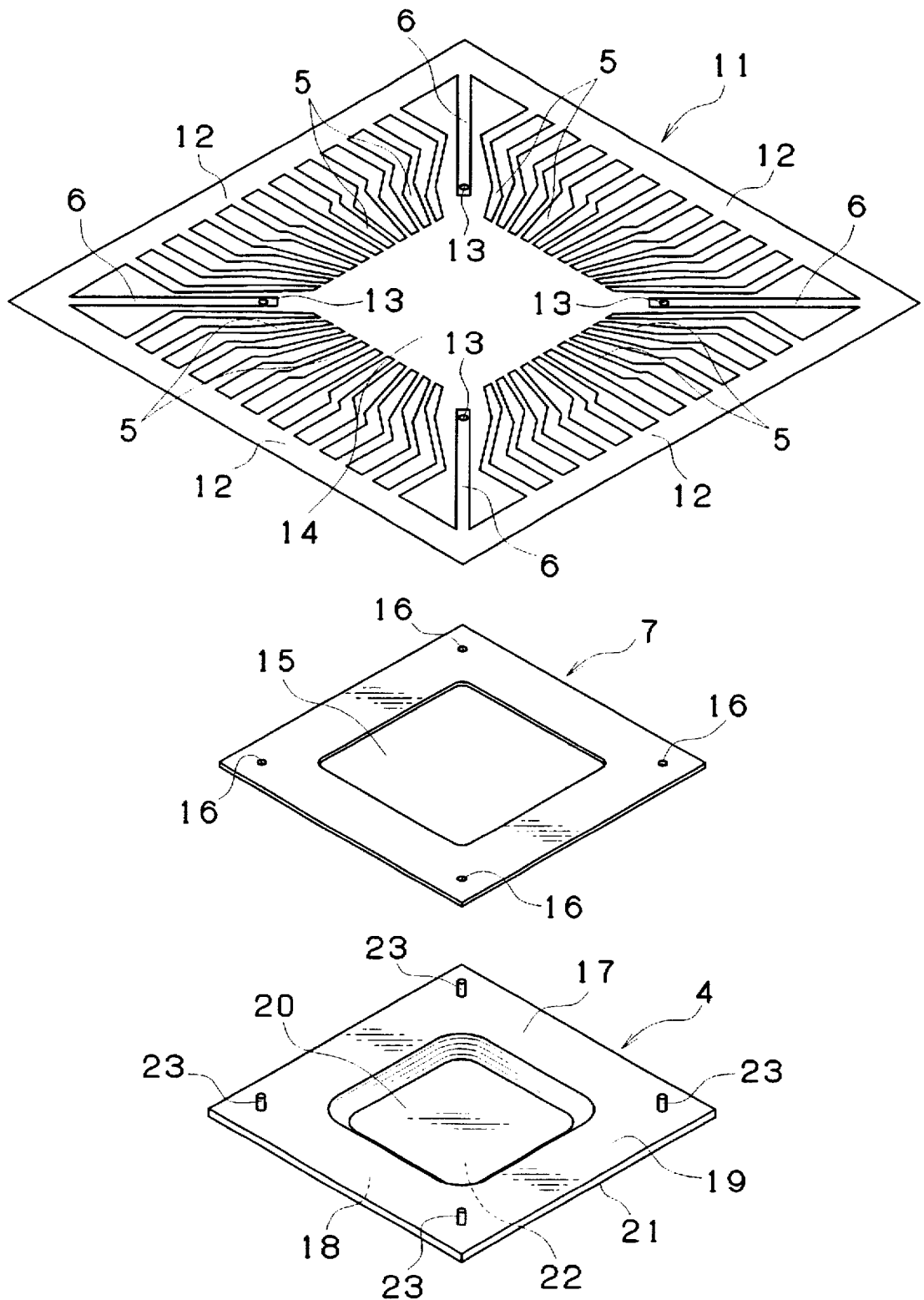
FIG. 2 is a perspective view of one combination of a leadframe, an insulative sheet and a heat sink in a disassembled state.

The semiconductor package 1 shown in FIG. 1 is produced roughly as follows. First, a leadframe 11 such as shown in FIG. 2 is prepared. The leadframe 11 is square in configuration and made up of an outer gallery 12, a plurality of leads 5 extending towards the center from four sides of the outer gallery 12 and four support bars 6 located at four corners of the outer gallery 12. The leads 5 and the support bars 6 define a square center opening 14 surrounded by their inner end. Each support bar 6 is provided at its inner end with a bore 13. The leadframe 11 is made of a flat metallic plate conventionally used in general by means of die-cutting or etching. Although a square leadframe 11 is exemplified, the configuration of the leadframe varies depending on the configuration of the semiconductor die 2 used in combination.

An electrically insulative sheet 7 is made of a plastic sheet such as polyamide sheet by means of die-cutting. The insulative sheet 7 is square in configuration and provided with a center opening 15 somewhat smaller than the center opening 14 in the leadframe 11. The insulative sheet 7 is further provided with bores 16 at four corners.

A heat sink 4 is made of a relatively thin metallic plate via press-shaping. The metallic plate is made of a material of high thermal conductivity such as aluminium. The heat sink 4 is square in configuration and provided with opposite, parallel first and second surfaces 17, 18. The first surface 17 includes a depressed central die support 20 and a circumferential lead support 19 surrounding the die support 20. The die support 20 is square in configuration which is somewhat smaller than the center opening 15 in the insulative sheet 7. The second surface 18 includes a projecting central section 22 opposite to the die support 20 and a circumferential section 21 opposite to the lead support 19. The projecting central section 22 is exposed outside the plastic package 10 for accelerated dissipation of heat.

Thanks to such a configuration, the heat sink 4 can be made of a thin plate material. Such a thin plate material can be continuously delivered from a roll and well suited for continuous processing and shaping.

Such a specified configuration of the heat sink 4 provides an elongated boundary between the heat sink 4 and the plastic package 10, which well deters outside contaminant from invading into the interior of the plastic package 10.

The heat sink 4 is further provided at the four corners on the lead support 19 with projections 23 arranged in alignment with the bores 13 in the support bars 6 and the bores 16 in the insulative sheet 7.

Figure 3:
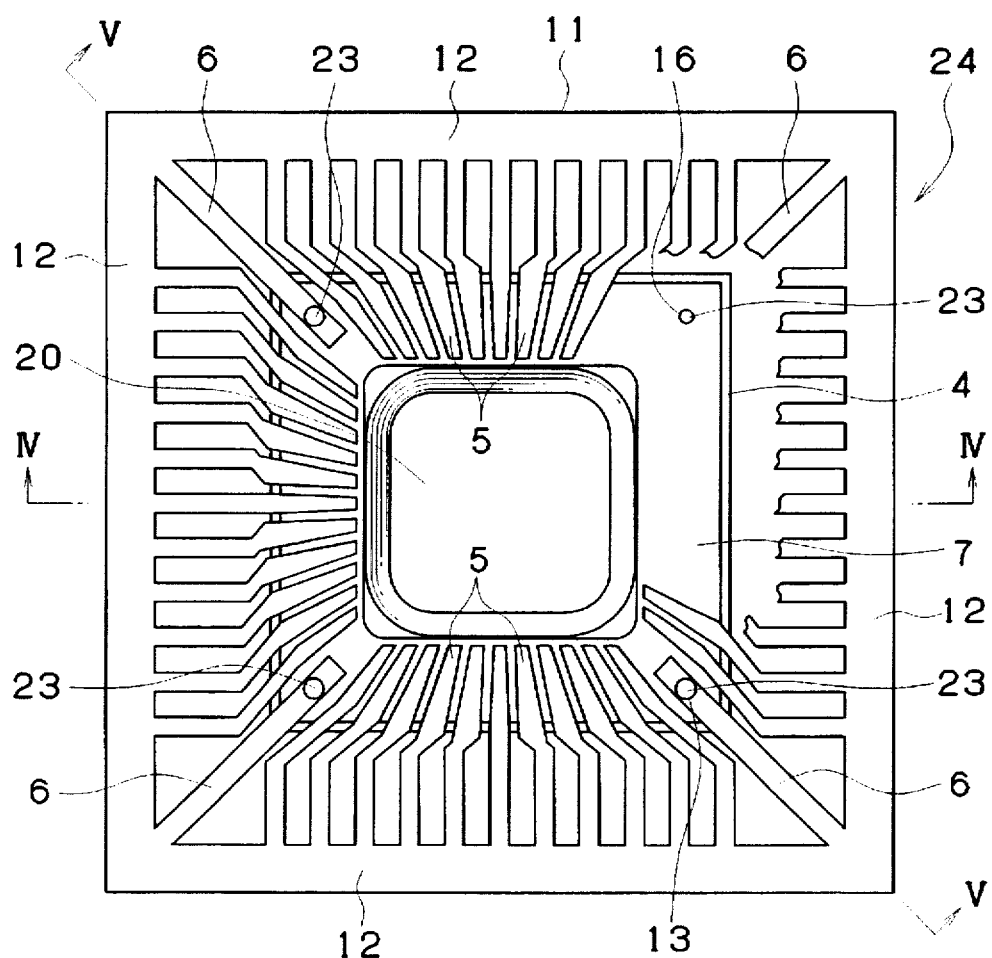
FIG. 3 is a top plan view, partly cut off, of a leadframe assembly.
Figure 4:
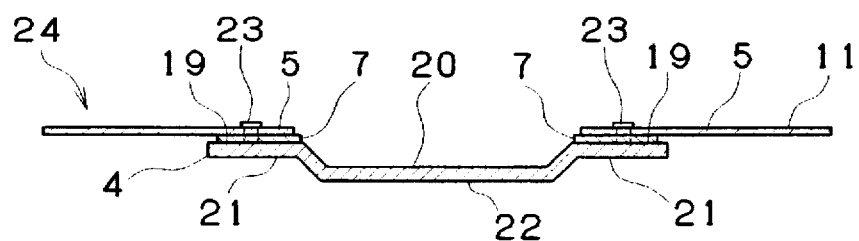
FIG. 4 is a section taken along a line W—W in FIG. 3.
Figure 5:
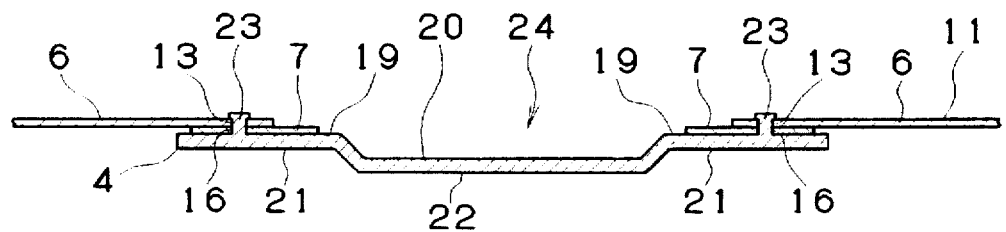
FIG. 5 is a section taken along a line V—V in FIG. 3.

FIGS. 3 to 5 shows a leadframe assembly 24 made up of the leadframe 11, the insulative sheet 7 and the heat sink 4 assembled together in one body. First, the insulative sheet 7 is placed on the lead support 19 on the heat sink 4 with the projections 23 being received in the bores 16. The inner ends of the leads 5 and the support bars 6 of the leadframe 11 are placed on the insulative sheet 7 and the projections 23 on the heat sink 4 are inserted into the bores 13 in the support bars 6. The head of each projection 23 is crushed in order to firmly unite the leadframe 11, the insulative sheet 7 and the heat sink 4 together. The heat sink 4 is supported on the leadframe 11 via the four support bars 6. Since the heat sink 4 is made of a thin, light metallic plate, such support for the heat sink 4 does not cause any substantial deformation of the support bars 6.

Figure 6:
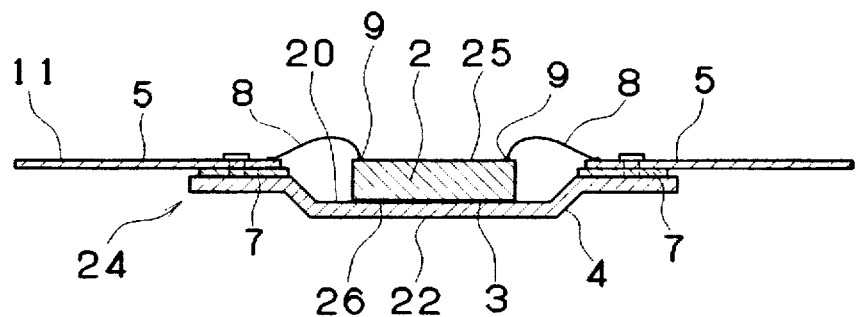
FIG. 6 is a sectional side view of the leadframe assembly combined with a semiconductor die.

Next as shown in FIG. 6, the semiconductor die 2 is placed on the die support 20 on the heat sink 4 in the leadframe assembly 24. The semiconductor die 2 is provided parallel, opposite first and second surfaces 25, 26. A plurality of contact pads 9 are juxtaposed along the circumference on the first surface 25 and the second surface 26 is bonded onto the die support 20 on the heat sink 4 via the thermally conductive adhesive 3. Each bond wire 8 is connected at its inner end to one contact pad 9 on the semiconductor die 2 and, at its outer end, to one lead 5 on the leadframe 11. Because the leads 5 are directly supported on the insulative sheet 7 relatively poor in elastic nature, they do not move much at connection with the bond wires 8.

Figure 7:
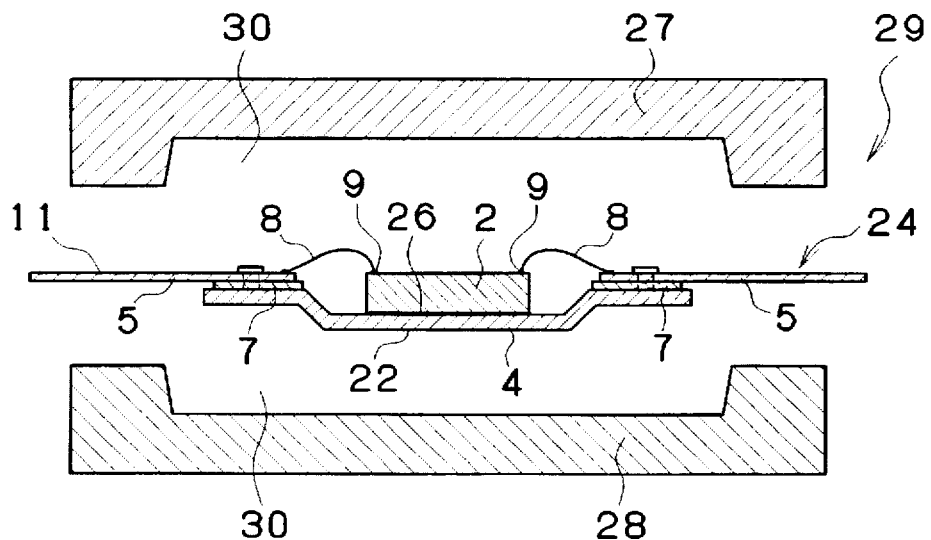
FIG. 7 is a sectional side view of the leadframe assembly and the semiconductor die placed in a shaping mold.

Next, as shown in FIG. 7, the leadframe assembly 24 is placed in a cavity of a shaping mold 29 made up of mold halves 27 and 28. After closing the shaping mold 29, encapsulant is filled into the cavity 30. By this filling of the encapsulant, the projecting central section 22 of the heat sink 4 is brought into pressure contact with the wall of the cavity 30. Thus, the heat sink 4, the semiconductor die 2, the inner ends of the leads 5, the insulative sheet 7 and the bond wires 8 are embraced by the encapsulant but the projecting central section 22 of the heat sink 4 and outer ends of the leads 5 as well as the support bars 6 are exposed outside the encapsulant. After solidification of the encapsulant by cooling, the shaping mold 29 is opened to deliver a crude semiconductor package 1 including the plastic package 10 formed by the solidified encapsulant. Next, the outer gallery 12 of the leadframe 11 is removed to obtain independent leads 5 separated from each other. The support bars 6 are not exposed outside the plastic package 10. When necessary, the exposed outer ends of the leads 5 may be properly bent.

Figure 8:
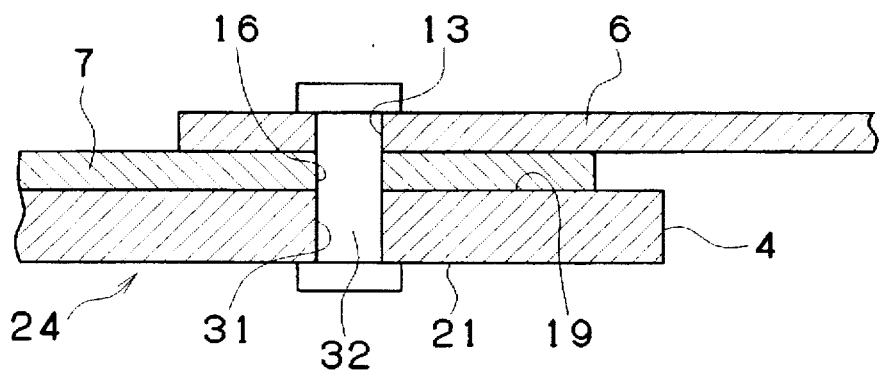
FIG. 8 is a sectional side view of different formation of a leadframe assembly.

Another process for formation of the leadframe assembly 24 is shown in FIG. 8. In the case of this embodiment, bores 31 are formed in the heat sink 4 instead of the projections 23. The bore 13 in each support bar 6, an associated bore 16 in the insulation sheet 7 and an associated bore 31 in the heat sink 4 are aligned for insertion of a rivet 32 whose head is then crushed to unite the leadframe 11, the insulative sheet 7 and the heat sink 4 together.

Figure 9:
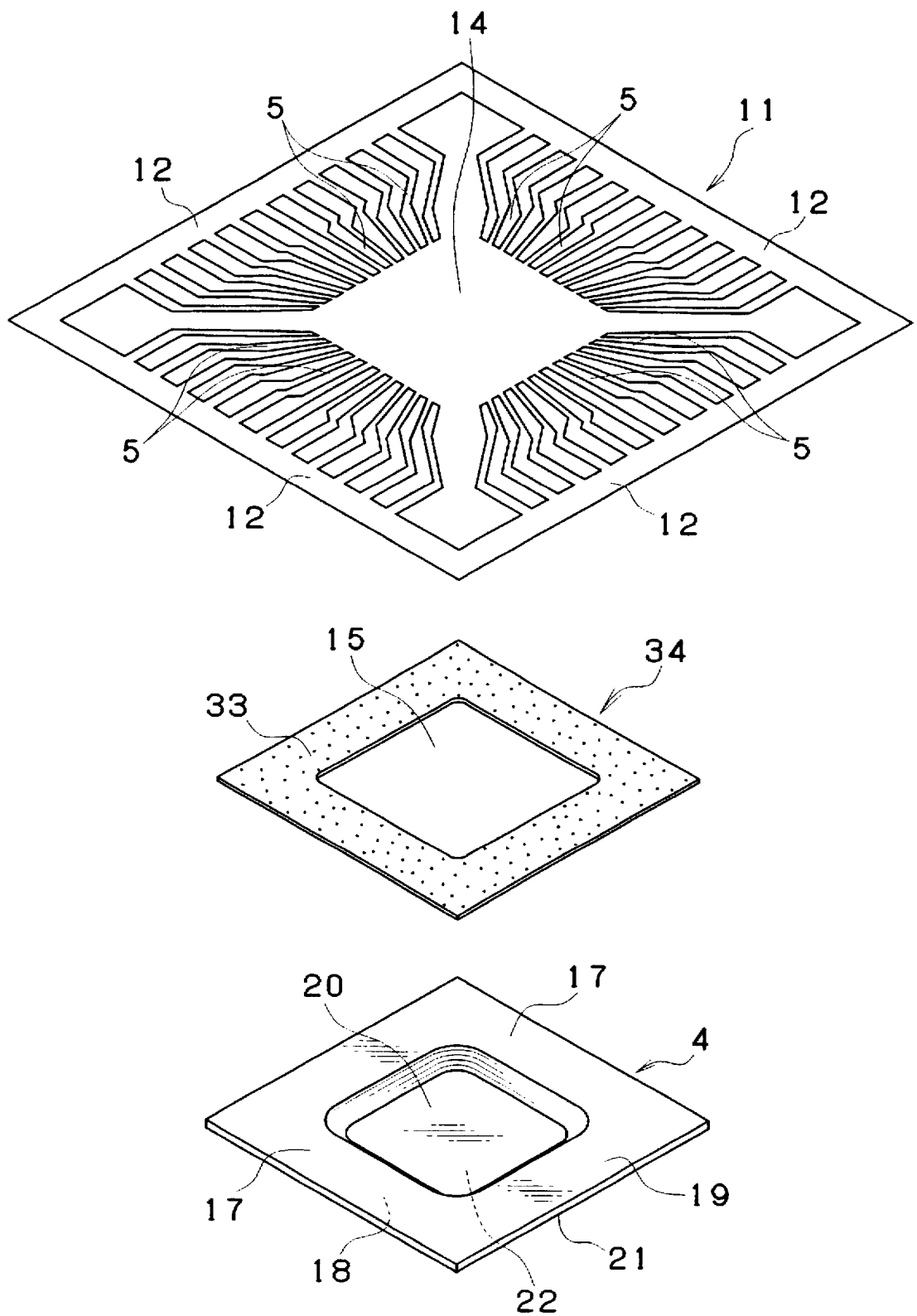
FIG. 9 is a perspective view of another combination of a leadframe, an insulative sheet and a heat sink in a disassembled state.
Figure 10:
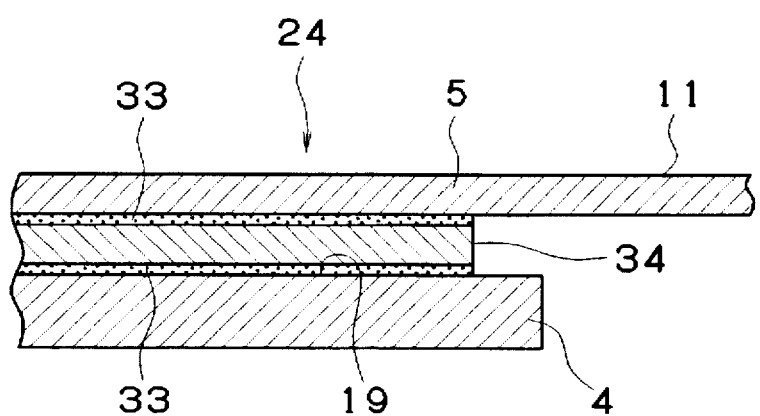
FIG. 10 is an enlarged sectional side view of the other example of the leadframe.

In the case of the embodiment shown in FIGS. 9 and 10, the leadframe assembly 25 is formed by use of an electrically insulative tape 34 coated with polyamide type organic adhesive 33 instead of the insulative sheet 7. The leadframe 11 is bonded to one surface and the heat sink 4 to the other surface of the insulative tape 34 and, as a consequence, no support bars 6 are formed on the leadframe 11. The leads 5 on the leadframe 11 are bonded onto the lead support 19 on the heat sink 4 via the insulative tape.

In accordance with the present invention, a heat sink formed by press-shaping of a relatively thin metallic plate is provided with a die support depressed from surrounding lead support and a projecting central section opposite to the depressed die support. This configuration of the heat sink provides elongated boundary between the heat sink and the encapsulating plastic package, which well prevents internal invasion of contaminant. The thin metallic plate can be delivered from a roll and, as a consequence well suited for continuous processing.

We claim:

1. A plastic molded semiconductor package comprising
    a substantially flat heat sink including a depressed central die support and a circumferential lead support surrounding said die support,
    a semiconductor die arranged on said die support of said heat sink and provided with juxtaposed contact pads,
    an electrically insulative layer arranged on said lead support of said heat sink,
    a plurality of juxtaposed, electrically conductive leads attached at inner ends to said electrically insulative layer,
    a plurality of support bars arranged at inner ends on said electrically insulative layer and united to said lead support of said heat sink whilst sandwiching said electrically insulative layer, bond wires each connecting one of said leads to one of said contact pads on said semiconductor die, and a plastic package encapsulating said heat sink, said semiconductor die, said inner ends of said leads, said support bars and said bond wires whilst exposing a projecting central surface of said heat sink opposite to said die support outside.

2. A plastic molded semiconductor package comprising a metallic heat sink provided with opposite, parallel first and second surfaces, said first surface including a depressed central die support as well as a circumferential lead support surrounding said die support, and said second surface including a projecting central section opposite to said die support as well as a circumferential section opposite to said lead support;

a semiconductor die provided with opposite, parallel first and second surfaces, said first surface including a plurality of juxtaposed contact pads, and said second surface being attached to said die support of said heat sink;

a plurality of juxtaposed, electrically conductive leads each provided with an inner end which is supported on said lead support of said heat sink;

an electrically insulative layer arranged on said lead support of said heat sink;

a plurality of support bars arranged at inner ends on said electrically insulative layer and united to said lead support of said heat sink whilst sandwiching said electrically insulative layer;

a plurality of bond wires each connecting one said contact pad on said semiconductor die to one said inner end of said lead; and a plastic package encapsulating said heat sink, said semiconductor die, said inner ends of said leads, said support bars and said bond wires whilst exposing said projecting central section of said second surface on said heat sink.

3. A plastic molded semiconductor package as claimed in claim 1 in which said electrically insulative layer is made of a polyamide sheet.

4. A plastic molded semiconductor package as claimed in claim 2 in which said electrically insulative layer is made of a polyamide sheet.

5. A plastic molded semiconductor package as claimed in claim 1 in which said heat sink is provided with at least one projection formed on said lead support, said electrically insulative layer and each said support bar are provided with respective bores, said projection on said heat sink is received in said bores in said electrically insulative layer and said support bar, respectively, and a head of said projection is crushed to unite said support bar to said lead support of said heat sink whilst sandwiching said electrically insulative layer between said support bar and said lead support of said heat sink.

6. A plastic molded semiconductor package as claimed in claim 2 in which said heat sink is provided with at least on projection formed on said lead support, said electrically insulative layer and each said support bar are provided with respective bores, said projection on said heat sink is received in said bores in said electrically insulative layer and said support bar, respectively, and a head of said projection is crushed to unite said support bar to said lead support of said heat sink whilst sandwiching said electrically insulative layer between said support bar and said lead support of said heat sink.

7. A plastic molded semiconductor package as claimed in claim 1 in which said lead support of said heat sink, said electrically insulative layer and each said support bar are provided with respective bores formed at corresponding positions, and a rivet crushed at its head is received in said bores to unite said support bar to said lead support of said heat sink whilst sandwiching said electrically insulative layer between said support bar and said lead support of said heat sink.

8. A plastic molded semiconductor package as claimed in claim 2 in which said lead support of said heat sink, said electrically insulative layer and each said support bar are provided with respective bores formed at corresponding positions, and a rivet crushed at its head is received in said bores to unite said support bar to said lead support of said heat sink whilst sandwiching said electrically insulative layer between said support bar and said lead support of said heat sink.

9. A plastic molded semiconductor package comprising a substantially flat heat sink including a depressed central die support as well as a circumferential lead support surrounding said die support, a semiconductor die provided with juxtaposed contact pads and arranged on said die support of said heat sink, an electrically insulative sheet arranged on said lead support of said heat sink, a plurality of electrically conductive leads juxtaposed to each other in contact at inner ends with said electrically insulative sheet, a plurality of support bars arranged at inner ends on said electrically insulative sheet and united to said lead support of said heat sink whilst sandwiching said electrically insulative sheet, a plurality of electrically conductive bond wires each connecting one of said contact pads to one of said leads, and a plastic package encapsulating said heat sink, said semiconductor die, said inner ends of said leads, said support bars and said bond wires whilst exposing a central section of said heat sink opposite to said die support outside.

\* \* \* \* \*